(12) United States Patent
Main et al.

(10) Patent No.: US 6,208,205 B1
(45) Date of Patent: Mar. 27, 2001

(54) AMPLIFIER CIRCUIT AND METHOD FOR REDUCING NOISE THEREIN

(75) Inventors: William E. Main, Mesa; Danielle L. Coffing, Tempe, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/351,168

(22) Filed: Jul. 12, 1999

(51) Int. Cl.[7] ....................................................... H03F 1/24
(52) U.S. Cl. .............................. 330/98; 330/310; 330/257
(58) Field of Search ................................ 330/98, 99, 100, 330/252, 257, 306, 310

(56) References Cited

U.S. PATENT DOCUMENTS

| | | | |
|---|---|---|---|
| 4,336,502 | * | 6/1982 | Goto ........................................ 330/257 |
| 5,034,700 | * | 7/1991 | Herrmann et al. ..................... 330/253 |
| 5,264,805 | * | 11/1993 | Yokozaki ............................... 330/306 |
| 5,418,492 | * | 5/1995 | Wang et al. ........................... 330/306 |
| 5,489,873 | * | 2/1996 | Kamata et al. ....................... 330/107 |
| 5,631,598 | * | 5/1997 | Miranda et al. ...................... 330/254 |

OTHER PUBLICATIONS

Motorola Data Sheet, "Wideband FM IF Subsystem–MC13158", Motorola Analog IC Device Data, 1996, pp. 1–23.

* cited by examiner

*Primary Examiner*—Robert Pascal
*Assistant Examiner*—Khanh Van Nguyen
(74) *Attorney, Agent, or Firm*—Anthony M. Martinez

(57) ABSTRACT

A transconductance amplifier (67) includes a multiple-stage amplifier (99) for amplifying an Intermediate Frequency (IF) signal. The transconductance amplifier includes a feedback path (103) having a resistance (105) for providing a feedback signal from an output of the multiple-stage amplifier (99) to an input of the multiple-stage amplifier (99). The resistance (105) of the feedback path (103) is selected so that an input impedance of the transconductance amplifier is equal to a source impedance at an input terminal (82) of the transconductance amplifier (67) and an output impedance of the transconductance amplifier (67) is equal to a load impedance at an output terminal (84) of the transconductance amplifier (67).

19 Claims, 2 Drawing Sheets

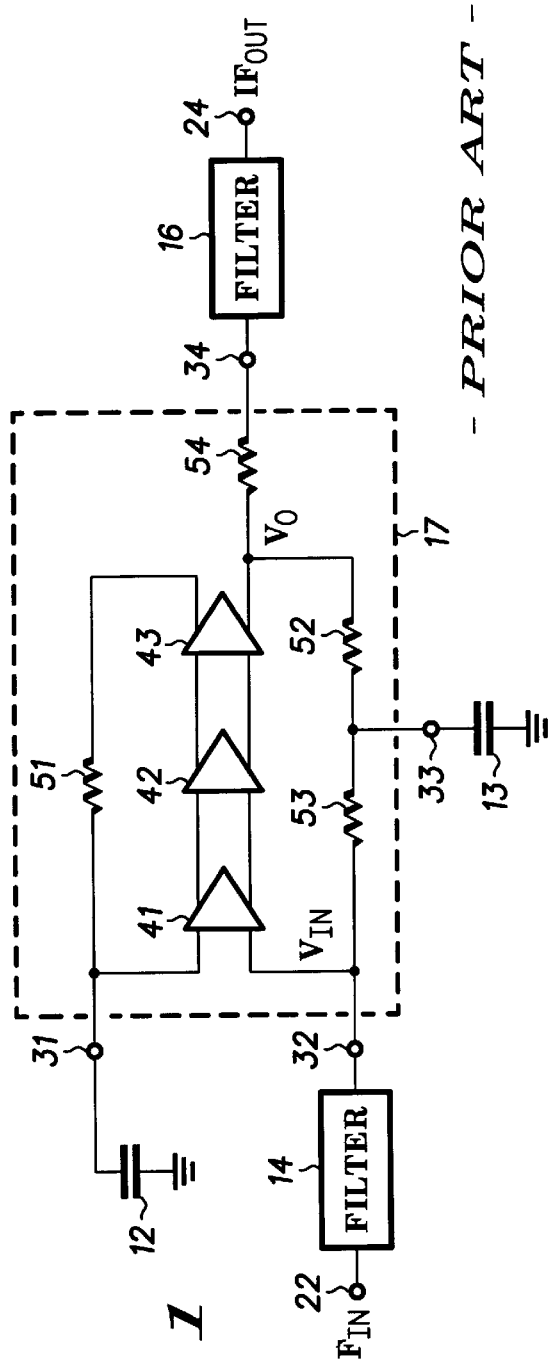
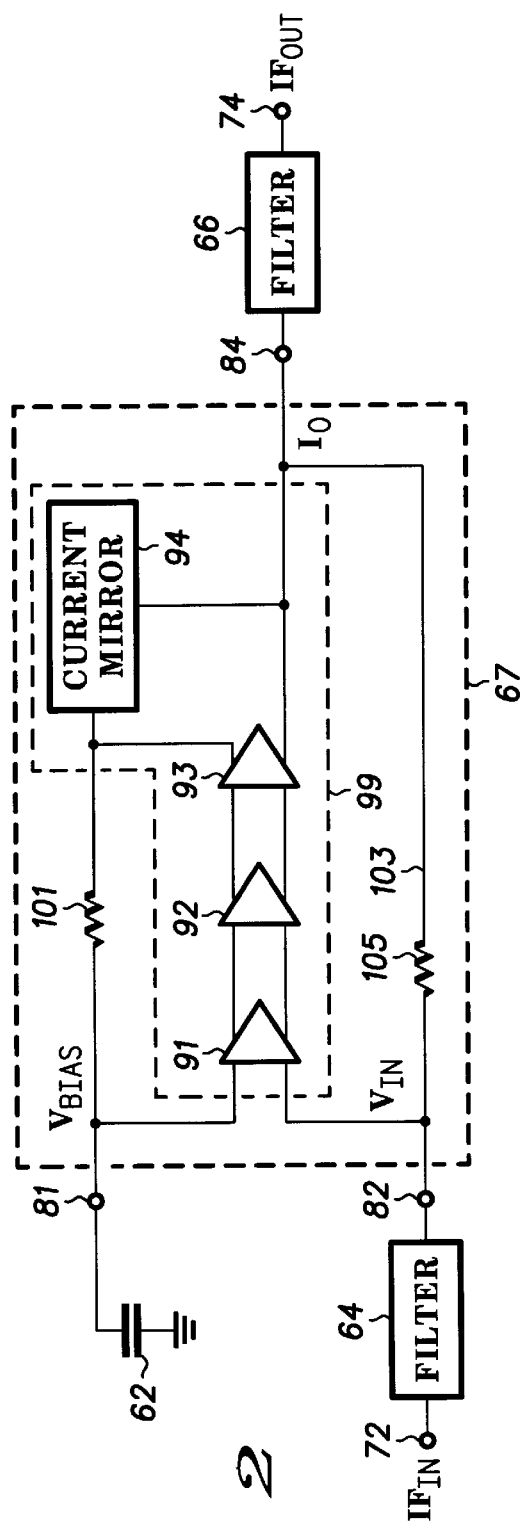

AMPLIFIER CIRCUIT AND METHOD FOR REDUCING NOISE THEREIN

FIELD OF THE INVENTION

The present invention relates, in general, to amplifier circuits and, more particularly, to Intermediate Frequency (IF) amplifier circuits.

BACKGROUND OF THE INVENTION

An amplifier is an element used in many communication circuit configurations. For example, amplifiers are used in mixers, filters, multipliers, and oscillators. An input signal is applied to an amplifier and amplified by the amplifier. Parameters that affect the performance of an amplifier are gain, noise, and power dissipation.

Intermediate Frequency (IF) amplifiers are used in receiver circuits for receiving modulated Radio Frequency (RF) signals in wireless communication applications such as cellular telephones or cordless telephones. The received modulated RF signal is translated to an Intermediate Frequency (IF) signal for demodulation. An IF amplifier amplifies the IF signal and provides the amplified IF signal to other components of the receiver circuit.

One prior art IF amplifier includes a voltage gain amplifier coupled between two ceramic filters. It is desirable to have an IF amplifier with low noise voltage, low power consumption, and a minimum number of external components. In addition, it is desirable for the input and output impedances of the IF amplifier to match the impedances of the ceramic filters. A prior art IF amplifier includes separate source and load matching resistors for matching the impedances of the two ceramic filters. However, the separate source and load resistors increase the power dissipation of the IF amplifier.

Accordingly, it would be advantageous to have an amplifier circuit for amplifying IF signals and method for reducing noise in the amplifier circuit. It would be of further advantage for the amplifier circuit to have low power consumption and a minimum number of external components.

BRIEF DESCRIPTION OF THE DRAWINGS

FIG. 1 is a schematic diagram of a prior art receiver circuit;

FIG. 2 is a schematic diagram of a receiver circuit in accordance with an embodiment of the present invention.

DETAILED DESCRIPTION OF THE DRAWINGS

Figure 3:
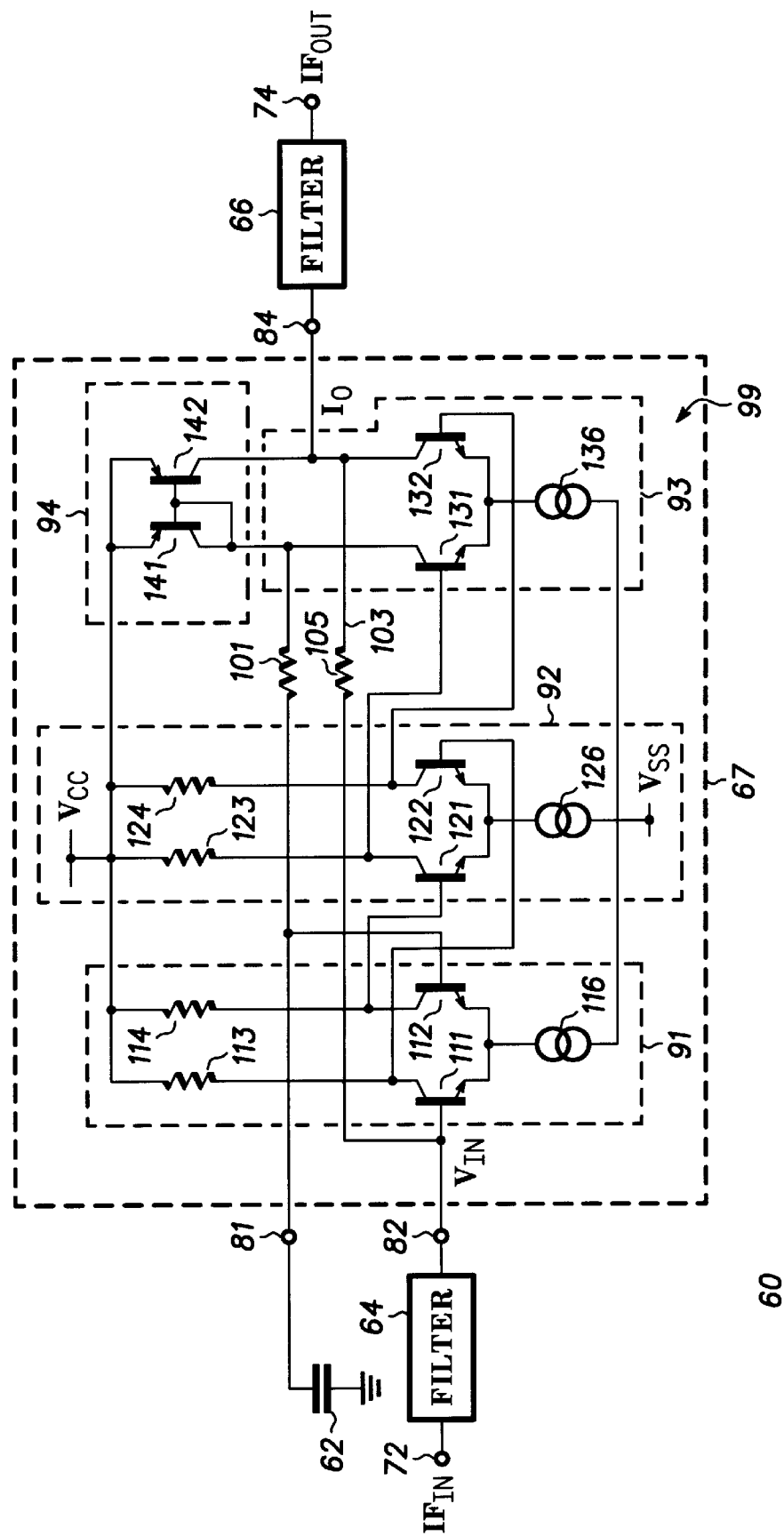
FIG. 3 is a more detailed schematic diagram of the receiver circuit shown in FIG. 2.

FIG. 1 is a schematic diagram of a portion of a prior art receiver circuit 10. Receiver circuit 10 includes decoupling capacitors 12 and 13, filters 14 and 16, and an Intermediate Frequency (IF) amplifier circuit 17. In addition, receiver circuit 10 has an input terminal 22 for receiving an IF signal labeled $IF_{IN}$ and an output terminal 24 for providing an amplified IF signal labeled $IF_{OUT}$.

IF amplifier circuit 17 is an integrated circuit having four electrical connection terminals: (1) a decoupling pin 31, (2) an input pin 32, (3) a decoupling pin 33, and (4) an output pin 34. Decoupling capacitor 12 has a first terminal coupled to decoupling pin 31 and a second terminal coupled to a power supply voltage such as, for example, ground potential. Input terminal 22 is coupled to input pin 32 via filter 14 and output pin 34 is coupled to output terminal 24 via filter 16. Filters 14 and 16 are bandpass filters for eliminating noise components at frequencies outside the passband. Decoupling capacitor 13 has a first terminal connected to decoupling pin 33 and a second terminal coupled to a power supply voltage such as, for example, ground potential.

IF amplifier circuit 17 includes three cascaded gain stages 41, 42, and 43. Gain stage 41 has a first input terminal connected to pin 31, a second input terminal connected to input pin 32, a first output terminal connected to a first input terminal of gain stage 42, and a second output terminal connected to a second input terminal of gain stage 42. Gain stage 42 has a first output terminal connected to a first input terminal of gain stage 43 and a second output terminal connected to a second input terminal of gain stage 43. Gain stage 43 has a first output terminal coupled to the first input terminal of gain stage 41 via a feedback resistor 51 and a second output terminal connected to output pin 34 via a matching resistor 54. In addition, the second output terminal of gain stage 43 is coupled to pin 33 via a resistor 52 and coupled to the second input terminal of gain stage 41 via resistors 52 and 53.

The resistance of matching resistor 53 is chosen so that the input impedance of IF amplifier circuit 17 at input pin 32 is matched to a source impedance provided by filter 14. In other words, filter 14 has a resistance that generates a source impedance at input pin 32 and the resistance value of matching resistor 53 is chosen so that the input impedance of IF amplifier circuit 17 at input pin 32 is substantially equal to the source impedance of filter 14. The resistance of matching resistor 53 is therefore substantially equal to the source resistance at input pin 32, which is the resistance of filter 14.

The resistance of matching resistor 54 is chosen so that the output impedance of IF amplifier circuit 17 at output pin 34 is matched to a load impedance provided by filter 16. The resistance of matching resistor 54 is therefore substantially equal to the load resistance at output pin 34, which is the resistance of filter 16. Matching resistor 54 is a passive device that dissipates energy, thereby increasing the power dissipation of IF amplifier circuit 17.

In operation, signal $IF_{IN}$ is filtered by filter 14 for providing a filtered IF signal to IF amplifier circuit 17 at input pin 32. IF amplifier circuit 17 amplifies signal $IF_{IN}$ and provides amplified IF signal $IF_{OUT}$ at output terminal 24. Filter 14 eliminates noise components of signal $IF_{IN}$ at frequencies outside the passband. Filter 16 eliminates noise components of the amplified IF signal provided at output pin 34.

Gain stages 41, 42, and 43 are voltage gain stages that form a voltage gain amplifier having an input voltage signal $V_{IN}$ and an output voltage signal $V_O$. Signal $V_O$ has a Direct Current (DC) component and an Alternating Current (AC) component. Resistor 52 and capacitor 13 form a low pass filter for eliminating or decoupling the AC component of signal $V_O$ so that only the DC component of signal $V_O$ is provided as a feedback signal to the second input terminal of gain stage 41 via resistors 52 and 53. In other words, a feedback path provided by resistors 52 and 53 includes shunt capacitance provided by decoupling capacitor 13 for eliminating the AC component of signal $V_O$. Capacitor 13 is also referred to as a shunt capacitor.

Capacitor 12 is a decoupling capacitor for eliminating the AC component of a bias signal provided to the first input terminal of gain stage 41 so that only the DC component of the bias signal is provided to the first input terminal of gain stage 41.

FIG. 2 is a schematic diagram of a portion of a receiver circuit 60 in accordance with an embodiment of the present invention. Receiver circuit 60 includes a decoupling capacitor 62, filters 64 and 66, and an IF amplifier circuit 67. In addition, receiver circuit 60 has an input terminal 72 for receiving an IF signal labeled $IF_{IN}$ and an output terminal 74 for providing an amplified IF signal labeled $IF_{OUT}$.

IF amplifier circuit 67 is a transconductance amplifier that receives a voltage signal $V_{IN}$ and provides a current signal $I_O$. Further, IF amplifier circuit 67 is an integrated circuit having three electrical connection terminals: (1) a decoupling pin 81, (2) an input pin 82, and (3) an output pin 84. Input terminal 72 is coupled to input pin 82 via filter 64 and output pin 84 is coupled to output terminal 74 via filter 66. Filters 64 and 66 are bandpass filters for eliminating noise components at frequencies outside the passband. By way of example, filters 64 and 66 are ceramic two-pole Chebyshev bandpass filters centered at approximately 10.7 megahertz (MHz) with a pass bandwidth of approximately 300 kilohertz (kHz). IF amplifier circuit 67 provides approximately 40 decibels (dB) of gain between input pin 82 and output pin 84.

In this embodiment, IF amplifier circuit 67 includes three cascaded gain stages 91, 92, and 93 and an output stage 94. Gain stages 91, 92, and 93 and output stage 94 form a multiple-stage amplifier 99. Gain stage 91 is a voltage gain stage having a first input terminal connected to decoupling pin 81, a second input terminal connected to input pin 82, a first output terminal connected to a first input terminal of gain stage 92, and a second output terminal connected to a second input terminal of gain stage 92. Gain stage 92 is a voltage gain stage having a first output terminal connected to a first input terminal of gain stage 93 and a second output terminal connected to a second input terminal of gain stage 93. Gain stage 93 is a transconductance stage having a first output terminal coupled to the first input terminal of gain stage 91 via a bias feedback resistor 101 and a second output terminal connected to output pin 84. Output stage 94 is a current mirror circuit having a first terminal connected to the first output terminal of gain stage 93 and a second terminal connected to the second output terminal of gain stage 93.

The transconductance of multiple-stage amplifier 99 ($gm_{99}$) is shown in equation 1.

$$gm_{99}=A_{91}*A_{92}*gm_{93} \quad (1)$$

$A_{91}$ and $A_{92}$ are the signal voltage gains of gain stages 91 and 92, respectively. $gm_{93}$ is the transconductance of gain stage 93.

Although IF amplifier circuit 67 is shown as having three cascaded gain stages, this is not a limitation of the present invention. Gain stages 91 and 92 provide additional voltage gain and are optional depending on the design requirements for gain. Gain stages 91 and 92 can be omitted, wherein the first input terminal of gain stage 93 is connected to a terminal of resistor 101 for receiving a bias signal and the second input terminal of gain stage 93 is connected to input pin 82 for receiving signal $V_{IN}$. Alternatively, IF amplifier circuit 67 can include more than three cascaded gain stages in order to increase the gain of IF amplifier circuit 67.

IF amplifier circuit 67 further includes a feedback path 103 having a resistance for providing a feedback signal from the second output terminal of gain stage 93 to the second input terminal of gain stage 91. Feedback path 103 includes a single resistor 105 for altering the resistance of feedback path 103. The feedback path 103 is devoid of a decoupling capacitor so that the feedback signal provided to the second input terminal of gain stage 91 via feedback path 103 includes both a DC component and an AC component. Because the feedback signal includes an AC component, this reduces the noise gain of IF amplifier circuit 67 relative to the signal gain of IF amplifier circuit 67. Thus, the noise voltage at the output of IF amplifier circuit 67 is reduced compared to prior art IF amplifier circuit 17, which provides a feedback signal having only a DC component.

The resistance of resistor 105 is chosen using the relationship shown in equation 2.

$$R_{105}=gm_{99}*R_{64}*R_{66} \quad (2)$$

$R_{105}$ is the resistance value of resistor 105. $R_{64}$ and $R_{66}$ are the resistance values of filters 64 and 66, respectively. Equation 2 shows that the resistance value of resistor 105 is a function of the transconductance of amplifier 99 and a function of the resistance values of filters 64 and 66.

The input impedance of IF amplifier circuit 67 at input pin 82 is matched to the source impedance at input pin 82 by using equation 2 to select the resistance value of resistor 105. It should be understood that the source impedance at input pin 82 is provided by filter 64. In addition, the output impedance of IF amplifier circuit 67 at output pin 84 is matched to the load impedance at output pin 84 by using equation 2 to select the resistance value of resistor 105. The output impedance at output pin 84 is provided by filter 66.

Matching the source and load impedances to the input and output impedances of IF amplifier circuit 67, respectively, maximizes power transfer and increases operating efficiency of IF amplifier circuit 67. In addition, matching the source and load impedances to the input and output impedances of IF amplifier circuit 67, respectively, maintains the bandpass characteristics of filters 64 and 66.

By way of example, if the resistance of filter 64 is 330 ohms, and the product of the resistance of filter 66 and the transconductance of multiple-stage amplifier 99 ($R_{66}*gm_{99}$) is 100, then the resistance value of resistor 105 is selected to be 33000 ohms using equation 2. Thus, the resistance of resistor 105 is more than one order of magnitude greater than the resistance of filter 64, which is the source resistance at input pin 82. In addition, the resistance of resistor 105 is more than one order of magnitude greater than the resistance of filter 66, which is the load resistance at output pin 84. Therefore, the resistance of resistor 105 is greater than the resistance of filter 64 and greater than the resistance of filter 66 using equation 2 to match the source impedance at input pin 82 to the input impedance of IF amplifier circuit 67 and to match the load impedance at output pin 84 to the output impedance of IF amplifier circuit 67.

As discussed hereinbefore, prior art IF amplifier circuit 17 (FIG. 1) includes a matching resistor 53 having a resistance value substantially equal to the source resistance at input pin 32 for matching the source impedance and input impedance. In addition, IF amplifier circuit 17 includes a matching resistor 54 having a resistance value substantially equal to the load resistance at output pin 34 for matching the load impedance and output impedance. On the other hand, IF amplifier circuit 67 (FIG. 2) uses a single resistor 105 having a resistance value greater than the resistances of filters 64 and 66 for matching the source impedance to the input impedance of IF amplifier circuit 67 and for matching the load impedance to the output impedance of IF amplifier circuit 67.

It should be noted that the power dissipation of IF amplifier circuit 67 is reduced compared to prior art IF amplifier circuit 17 (FIG. 1) by eliminating an output matching resistor (e.g., matching resistor 54) in the output stage of amplifier 99.

Bias feedback resistor 101 provides a bias signal, labeled $V_{BIAS}$, from the first output terminal of gain stage 93 to the first input terminal of gain stage 91. Capacitor 62 is a decoupling capacitor for eliminating the AC component of bias signal $V_{BIAS}$ so that only the DC component of bias signal $V_{BIAS}$ is provided to the first input terminal of gain stage 41. Although, resistor 101 is shown as a feedback resistor for supplying a DC bias signal to the first input terminal of gain stage 91, this is not a limitation of the present invention. Alternatively, signal $V_{BIAS}$ can be provided to the first input terminal of gain stage 91 by coupling a first terminal of resistor 101 to a power supply terminal for receiving a power supply voltage, wherein a second terminal of resistor 101 is commonly connected to the first input terminal of gain stage 91 and to pin 81.

FIG. 3 is a more detailed schematic diagram of receiver circuit 60 shown in FIG. 2. It should be understood that the same reference numerals are used in the figures to denote the same elements.

In the embodiment shown in FIG. 3, gain stage 91 includes transistors 111 and 112, resistors 113 and 114, and a current source 116. By way of example, transistors 111 and 112 are NPN bipolar transistors, each having a base, a collector, and an emitter. The base electrodes of transistors 111 and 112 serve as input terminals of gain stage 91 and the collector electrodes of transistors 111 and 112 serve as output terminals of gain stage 91.

The base of transistor 111 is connected to input pin 82, the emitter of transistor 111 is connected to the emitter of transistor 112, and the collector of transistor 111 is coupled for receiving a power supply voltage $V_{CC}$ via resistor 113. The base of transistor 112 is connected to pin 81 and the collector of transistor 112 is coupled for receiving power supply voltage $V_{CC}$ via resistor 114.

Current source 116 biases gain stage 91. Current source 116 has a first terminal commonly connected to the emitters of transistors 111 and 112 and a second terminal coupled for receiving a power supply voltage $V_{SS}$.

Gain stage 92 includes NPN bipolar transistors 121 and 122, resistors 123 and 124, and a current source 126. The base electrodes of transistors 121 and 122 serve as input terminals of gain stage 92 and the collector electrodes of transistors 121 and 122 serve as output terminals of gain stage 92.

The base of transistor 121 is connected to the collector of transistor 112, the emitter of transistor 121 is connected to the emitter of transistor 122, and the collector of transistor 121 is coupled for receiving power supply voltage $V_{CC}$ via resistor 123. The base of transistor 122 is connected to the collector of transistor 111 and the collector of transistor 122 is coupled for receiving power supply voltage $V_{CC}$ via resistor 124.

Current source 126 biases gain stage 92. Current source 126 has a first terminal commonly connected to the emitters of transistors 121 and 122 and a second terminal coupled for receiving power supply voltage $V_{SS}$.

Gain stage 93 includes NPN bipolar transistors 131 and 132, and a current source 126. The base electrodes of transistors 131 and 132 serve as input terminals of gain stage 93 and the collector electrodes of transistors 131 and 132 serve as output terminals of gain stage 93.

The base of transistor 131 is connected to the collector of transistor 121, the emitter of transistor 131 is connected to the emitter of transistor 132, and the collector of transistor 131 is coupled to the base of transistor 112 via resistor 101. The base of transistor 132 is connected to the collector of transistor 122 and the collector of transistor 132 is commonly connected to feedback path 103 and output pin 84.

Current source 136 biases gain stage 93. Current source 136 has a first terminal commonly connected to the emitters of transistors 131 and 132 and a second terminal coupled for receiving power supply voltage $V_{SS}$.

Output stage 94 is a current mirror circuit that includes PNP bipolar transistors 141 and 142. The base of transistor 141 is commonly connected to the base of transistor 142, the collector of transistor 141, and resistor 101. The emitter electrodes of transistors 141 and 142 are coupled for receiving power supply voltage $V_{CC}$. The collector electrode of transistor 142 is commonly connected to output pin 84 and to resistor 105.

Although transistors 111, 112, 121, 122, 131, 132, 141, and 142 are shown as bipolar transistors, this is not a limitation of the present invention. For example, transistors 111, 112, 121, 122, 131, 132, 141, and 142 can be Metal Oxide Semiconductor (MOS) transistors. It should be noted that the base of a bipolar transistor is referred to as the control electrode and the collector and emitter electrodes of the bipolar transistor are referred to as conduction electrodes. The gate electrode of a MOS transistor is also referred to as a control electrode and the drain and source electrodes of a MOS transistor are referred to as current carrying electrodes or conduction electrodes.

By now it should be appreciated that an IF transconductance amplifier circuit and method for reducing noise therein is provided. An advantage of the IF amplifier circuit is that it consumes less power than prior art IF amplifier circuits. Further, the IF transconductance amplifier circuit provided uses less external components and eliminates one pin when compared to prior art IF amplifier circuits.

What is claimed is:

1. An amplifier circuit, comprising:
    a transconductance amplifier having a transconductance, an input coupled to an input of the amplifier circuit, and an output coupled to an output of the amplifier circuit;
    a feedback path having a resistance for providing a feedback signal from the output of the transconductance amplifier to the input of the transconductance amplifier;
    wherein the resistance of the feedback path is a function of the transconductance of the transconductance amplifier; and
    wherein the resistance of the feedback path is chosen so that an input impedance of the amplifier circuit is substantially equal to a source impedance at the input of the amplifier circuit and an output impedance of the amplifier circuit is substantially equal to a load impedance at the output of the amplifier circuit.

2. The amplifier circuit of claim 1, wherein the feedback path is devoid of a shunt capacitor so that the feedback signal includes an Alternating Current (AC) component for reducing noise in the amplifier circuit.

3. The amplifier circuit of claim 1, wherein the feedback path includes a single resistor coupled between the input of the transconductance amplifier and the output of the transconductance amplifier.

4. The amplifier circuit of claim 1, further comprising:
    a first impedance coupled to the output of the amplifier circuit, wherein the first impedance provides the load impedance; and
    a second impedance coupled to the input of the amplifier circuit, wherein the second impedance provides the source impedance.

5. The amplifier circuit of claim 4, wherein the first and second impedances are ceramic bandpass filters.

6. The amplifier circuit of claim 1, wherein the transconductance amplifier comprises a gain stage having an input coupled to the input of the amplifier circuit and an output commonly coupled to the output of the amplifier circuit and to the feedback path.

7. The amplifier circuit of claim 1, wherein the transconductance amplifier is a multiple-stage transconductance amplifier comprising:

a first gain stage having a first input coupled to the input of the amplifier circuit;

a second gain stage having a first input coupled to a first output of the first gain stage and a second input coupled to a second output of the first gain stage; and a third gain stage having a first input coupled to a first output of the second gain stage, a second input coupled to a second output of the second gain stage, a first output commonly coupled to the output of the amplifier circuit and to the feedback path.

8. The amplifier circuit of claim 7, wherein the first gain stage comprises:

a first transistor having a control electrode coupled to the input of the amplifier circuit, a first conduction electrode coupled for receiving a first power supply voltage, and a second conduction electrode;

a second transistor having a control electrode, a first conduction electrode coupled for receiving the first power supply voltage, and a second conduction electrode coupled to the second conduction electrode of the first transistor; and a first current source having a first terminal coupled to the second conduction electrode of the first transistor and a second terminal coupled for receiving a second power supply voltage.

9. The amplifier circuit of claim 8, wherein the second gain stage comprises:

a third transistor having a control electrode coupled to the first conduction electrode of the second transistor, a first conduction electrode coupled for receiving the first power supply voltage, and a second conduction electrode;

a fourth transistor having a control electrode coupled to the first conduction electrode of the first transistor, a first conduction electrode coupled for receiving the first power supply voltage, and a second conduction electrode coupled to the second conduction electrode of the third transistor; and a second current source having a first terminal coupled to the second conduction electrode of the third transistor and a second terminal coupled for receiving the second power supply voltage.

10. The amplifier circuit of claim 9, wherein the third gain stage comprises:

a fifth transistor having a control electrode coupled to the first conduction electrode of the third transistor, a first conduction electrode coupled to the control electrode of the second transistor, and a second conduction electrode;

a sixth transistor having a control electrode coupled to the first conduction electrode of the fourth transistor, a first conduction electrode commonly coupled to the output of the amplifier circuit and to the feedback path, and a second conduction electrode coupled to the second conduction electrode of the fifth transistor; and a third current source having a first terminal coupled to the second conduction electrode of the fifth transistor and a second terminal coupled for receiving the second power supply voltage.

11. The amplifier circuit of claim 10, wherein the transconductance amplifier further comprises a current mirror circuit, wherein the current mirror circuit comprises:

a seventh transistor having a control electrode, a first conduction electrode commonly coupled to the control electrode of the seventh transistor and the first conduction electrode of the fifth transistor, and a second conduction electrode coupled for receiving the first power supply voltage; and an eighth transistor having a control electrode coupled to the control electrode of the seventh transistor, a first conduction electrode coupled to the first conduction electrode of the sixth transistor, and a second conduction electrode coupled for receiving the first power supply voltage.

12. The amplifier circuit of claim 7, further including a second feedback path having a resistance for providing a bias signal from a second output of the third gain stage to a second input of the first gain stage.

13. The amplifier circuit of claim 1, wherein the transconductance amplifier further includes a current mirror circuit coupled to the output of the amplifier circuit.

14. An integrated circuit, comprising:

a multiple-stage transconductance amplifier having a first input coupled for receiving a bias signal, a second input coupled to an input of the integrated circuit for receiving a voltage signal, and an output for providing a current signal to an output of the integrated circuit;

a feedback path for transmitting a feedback signal from the output of the multiple-stage transconductance amplifier to the second input of the multiple-stage transconductance amplifier;

wherein the feedback path is devoid of a decoupling capacitor so that the feedback signal includes an Alternating Current (AC) component for reducing noise in the integrated circuit; and wherein the multiple-stage transconductance amplifier includes a current mirror circuit coupled to the output of the integrated circuit.

15. The integrated circuit of claim 14, wherein the feedback path has a resistance that is selected so that an input impedance of the integrated circuit is substantially equal to a source impedance at the input of the integrated circuit and an output impedance of the integrated circuit is substantially equal to a load impedance at the output of the integrated circuit.

16. The integrated circuit of claim 14, wherein the feedback path has a resistance that is more than one order of magnitude greater than a source resistance at the input of the integrated circuit.

17. The integrated circuit of claim 14, wherein the multiple-stage transconductance amplifier comprises:

a first gain stage having a first input coupled to the first input of the multiple-stage transconductance amplifier and a second input coupled to the input of the integrated circuit;

a second gain stage having a first input coupled to a first output of the first gain stage and a second input coupled to a second output of the first gain stage; and a third gain stage having a first input coupled to a first output of the second gain stage, a second input coupled to a second output of the second gain stage, a first output coupled to the first input of the first gain stage, and a second output coupled to the output of the integrated circuit.

18. The integrated circuit of claim 17, wherein the current mirror circuit comprises:
  a first transistor having a control electrode, a first conduction electrode commonly coupled to the control electrode of the first transistor and the first output of the third gain stage, and a second conduction electrode coupled for receiving a power supply voltage; and
  a second transistor having a control electrode coupled to the control electrode of the first transistor, a first conduction electrode coupled to the second output of the third gain stage, and a second conduction electrode coupled for receiving the power supply voltage.

19. A method for reducing noise and power dissipation in a transconductance amplifier circuit, comprising the steps of:

providing a feedback path for transmitting a feedback signal from an output of the transconductance amplifier circuit to an input of the transconductance amplifier circuit, wherein the feedback signal has a Direct Current (DC) component and an Alternating Current (AC) component for reducing noise in the transconductance amplifier circuit; and setting a resistance of the feedback path so that an input impedance of the transconductance amplifier circuit is substantially equal to a source impedance at the input of the transconductance amplifier circuit and an output impedance of the transconductance amplifier circuit is substantially equal to a load impedance at the output of the transconductance amplifier circuit.

* * * * *